(12) United States Patent
Chung et al.

(10) Patent No.: US 7,703,911 B2
(45) Date of Patent: Apr. 27, 2010

(54) APPARATUS FOR FORMING A THIN FILM USING AN INKJET PRINTING METHOD

(75) Inventors: Jin-Koo Chung, Suwon-si (KR); Joon-Hoo Choi, Seoul (KR); Dong-Won Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/176,865

(22) Filed: Jul. 21, 2008

(65) Prior Publication Data

US 2008/0273072 A1 Nov. 6, 2008

Related U.S. Application Data

(62) Division of application No. 10/991,185, filed on Nov. 17, 2004, now Pat. No. 7,410,251.

(30) Foreign Application Priority Data

Nov. 17, 2003 (KR) ................................ 2003-81123

(51) Int. Cl.
*B41J 2/01* (2006.01)

(52) U.S. Cl. ..................................................... 347/101
(58) Field of Classification Search ......... 347/101–103, 347/105
See application file for complete search history.

(56) References Cited

U.S. PATENT DOCUMENTS

| 4,751,528 A | * | 6/1988 | Spehrley et al. | ............... 347/18 |
| 6,059,406 A | * | 5/2000 | Richtsmeier et al. | ......... 347/102 |
| 6,283,589 B1 | * | 9/2001 | Gelbart | ....................... 347/101 |

* cited by examiner

*Primary Examiner*—An H Do
(74) *Attorney, Agent, or Firm*—F. Chau & Associates, LLC

(57) ABSTRACT

In an apparatus of forming a thin film, the apparatus has a printing chamber that forms a thin film on a substrate. The apparatus has at least two drying chambers that receive the substrate on which the thin film is formed and dry the thin film on the substrate. The two drying chambers may be independently controlled. Accordingly, the apparatus may reduce process time for forming the thin film without contamination of the substrate.

10 Claims, 3 Drawing Sheets

APPARATUS FOR FORMING A THIN FILM USING AN INKJET PRINTING METHOD

CROSS-REFERENCE TO RELATED APPLICATIONS

This is a divisional application of U.S. application Ser. No. 10/991,185 filed on Nov. 17, 2004, which is now U.S. Pat. No. 7,410,251 issued Aug. 12, 2008, which claims priority to Korean Appln. No. 2003-81123 filed Nov. 17, 2003, the entireties of which are incorporated herein by reference.

BACKGROUND OF THE INVENTION

1. Field of the Invention

The present invention relates to an apparatus for forming a thin film. More particularly, the present invention relates to an apparatus capable of forming a thin film using an inkjet printing method.

2. Description of the Related Art

In general, an organic light emitting diode (OLED) has an organic light emitting layer formed between an anode electrode and a cathode electrode. Electrons from the anode electrode are combined with holes from the cathode electrode in the organic light emitting layer, so that molecules of the organic light emitting layer are in the excited state. When the excited molecules are changed into the ground state, the light is generated in the organic light emitting layer.

The OLED has various layers, such as a light emitting layer, a hole injection layer, a hole transport layer, an electron injection layer or an electron transport layer, etc. Usually, the layers for the OLED are formed using an organic material, and also formed by an inkjet printing method with an inkjet printing apparatus.

FIG. 1 is a schematic perspective view showing a conventional apparatus for forming a thin film.

Referring to FIG. 1, a conventional inkjet apparatus 50 has an inkjet printing chamber 10, a buffer chamber 20 and a drying chamber 30.

In the conventional inkjet printing apparatus 50, drying time for drying an organic material coated on a substrate is longer than printing time for coating the organic material on the substrate. Hence, a bottleneck phenomenon may occur while a thin film including the organic material is formed on the substrate.

Further, the drying chamber 30 has a plurality of substrate stages 40 so as to simultaneously dry a plurality of substrates on which the thin film is formed. However, the substrates loaded on the substrate stages 40 may not be dried simultaneously and completely. Thus, when the dried substrates are unloaded from the drying chamber 30 before all the substrates are completely dried, drying condition inside the drying chamber 30 may be rapidly changed, so that the substrates may be contaminated.

In order to prevent contamination of the substrates, when the substrates loaded into the drying chamber 30 are transferred to a next process chamber after the substrates are completely dried, throughput of the thin film forming process may be lowered.

BRIEF SUMMARY OF THE INVENTION

The present invention provides an apparatus capable of forming a thin film using an inkjet printing method.

In one aspect of the present invention, an apparatus for forming a thin film using an inkjet printing method includes a printing chamber and at least two drying chambers.

A process of forming a thin film on a substrate is performed in the printing chamber.

Each of the drying chambers receives the substrate on which the thin film is formed and dries the thin film on the substrate.

In another aspect of the present invention, an apparatus for forming a thin film using an inkjet printing method includes a printing chamber, a buffer chamber, at least two drying chambers and a cooling chamber.

A process of forming a thin film on a substrate is performed in the printing chamber.

The buffer chamber receives the substrate on which the thin film is formed.

Each of the drying chambers receives the substrate on which the thin film is formed from the buffer chamber. The drying chambers are independently controlled one to another to dry the thin film on the substrate.

The substrate on which the dried thin film is formed is cooled in the cooling chamber.

According to the apparatus for forming the thin film using the inkjet printing method, the apparatus includes at least two drying chambers that may be independently controlled. Thus, the apparatus may prevent contamination of the substrate and enhance throughput thereof.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE PREFERRED EMBODIMENT

Hereinafter, the present invention will be explained in detail with reference to the accompanying drawings.

Figure 1:
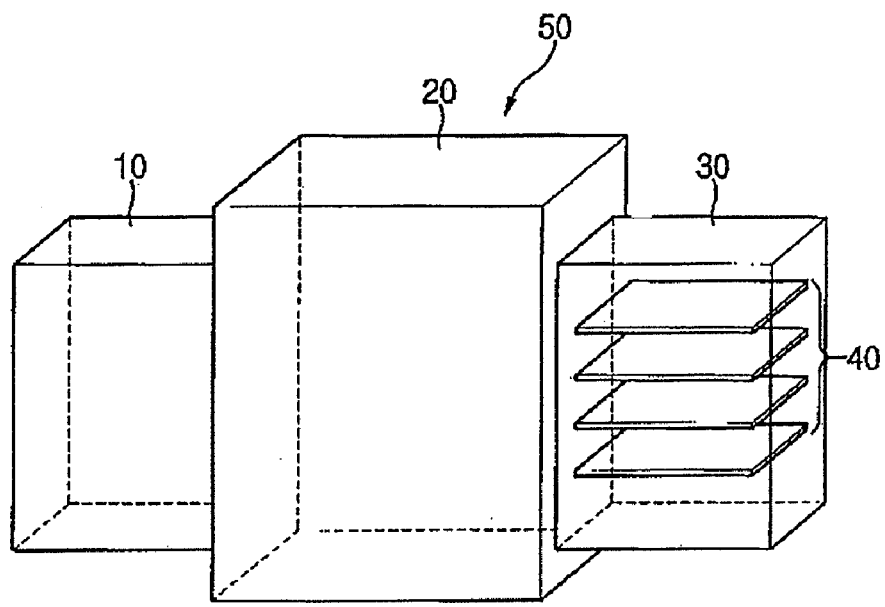
FIG. 1 is a schematic perspective view showing a conventional apparatus for forming a thin film.
Figure 2:
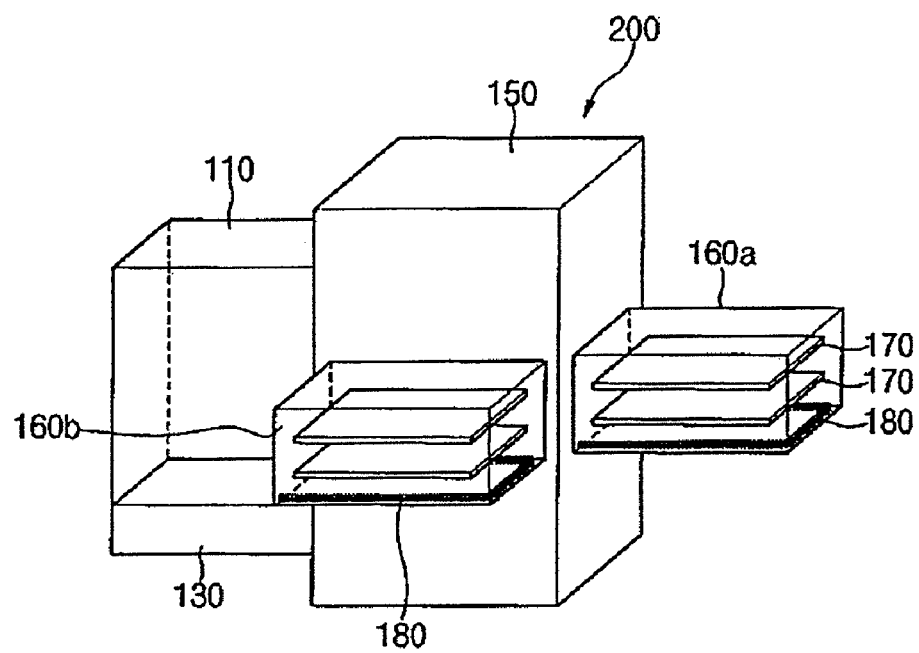
FIG. 2 is a schematic perspective view showing an apparatus for forming a thin film according to a first exemplary embodiment of the present invention.
Figure 3:
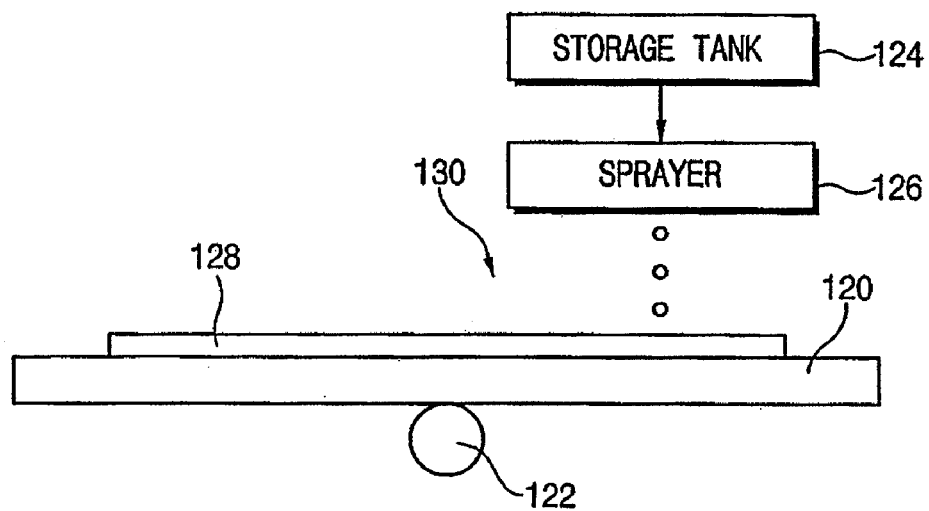
FIG. 3 is a schematic cross-sectional view showing an inkjet printer of the apparatus shown in FIG. 2.

FIG. 2 is a schematic perspective view showing an apparatus for forming a thin film according to a first exemplary embodiment of the present invention. FIG. 3 is a schematic cross-sectional view showing an inkjet printer of the apparatus shown in FIG. 2.

Referring to FIG. 2, an apparatus 200 is used to form a thin film on a substrate for a display panel. In the first embodiment, the thin film may be an organic layer or an inorganic layer, and the substrate may be a glass substrate. The apparatus 200 includes a printing chamber 110, a buffer chamber 150 and two drying chambers 160a and 160b. A process of forming the organic layer on a glass substrate, on which predetermined patterns are formed, by an inkjet printing method is performed in the apparatus 200. The buffer chamber 150 transfers the glass substrate on which the organic layer is formed to a next process chamber such as the drying chambers 160a and 160b. The drying chambers 160a and 160b dry the organic layer formed on the glass substrate.

The printing chamber 110 has a structure capable of loading and unloading the glass substrate and maintaining a vacuum state or a pressurized state higher than an atmospheric pressure therein. The printing chamber 110 is coupled to a first side of the buffer chamber 150. The printing chamber 110 also has an inkjet printer 130 that coats an organic material on the glass substrate by the inkjet printing method.

As shown in FIG. 3, the inkjet printer 130 includes a stage 120 to support the glass substrate 128, a transporter 122 to transport the stage 120 supporting the glass substrate 128 toward a direction on which the organic material is coated, a storage tank 124 to store the organic material for the organic layer and a sprayer 126 to spray the organic material from the storage tank 124 onto the glass substrate 128.

In the first embodiment, the sprayer 126 includes n units of head part (not shown) so as to spray the organic material from the storage tank 124 onto a thin film transistor substrate region of the glass substrate 128.

The buffer chamber 150 has a structure capable of loading and unloading the glass substrate 128. An atmosphere in the buffer chamber 150 is identical with that of the printing chamber 110 or the drying chambers 160a and 160b. The buffer chamber 150 is disposed between the printing chamber 110 and the drying chambers 160a and 160b. In the first embodiment, the two drying chambers include a first drying chamber 160a and a second drying chamber 160b.

In other words, the buffer chamber 150 is coupled to the printing chamber 110, the first drying chamber 160a and the second drying chamber 160b as shown in FIG. 2. Thus, the buffer chamber 150 may provide the glass substrate 128 from the printing chamber 110 to the first drying chamber 160a or the second drying chamber 160b, on which the organic layer is formed. The buffer chamber 150 may also provide the dried glass substrate 128 in the first drying chamber 160a or the second drying chamber 160b to the printing chamber 110.

Although not shown in FIGS. 2 and 3, the buffer chamber 150 further includes a transfer arm (not shown) transferring the glass substrate 128 from the printing chamber 110 to the first drying chamber 160a or the second drying chamber 160b, and vice versa.

The first and second drying chambers 160a and 160b are coupled to the first and second sides of the buffer chamber 150, respectively. Each of the first and second drying chambers 160a and 160b includes at least one substrate stage 170 supporting at least one glass substrate. In the first embodiment, each of the first and second drying chambers 160a and 160b includes two substrate stages 170.

Also, each of the first and second drying chambers 160a and 160b has a heater 180 supplying heat to the glass substrate 128 so as to dry the organic layer on the glass substrate 128.

Thus, since the apparatus 200 has the two drying chambers such as the first and second drying chambers 160a and 160b that may be independently controlled, the apparatus 200 may prevent contamination of the glass substrate 128 while the organic layer on the glass substrate 128 is dried, and effectively reduce drying time of the organic layer on the glass substrate 128.

In the first embodiment, the thin film, for example, such as the organic layer, the inorganic layer, etc., formed on an organic light emitting diode has been described, but the thin film may be formed on a liquid crystal display apparatus by using the inkjet printing method. The organic layer may be a light emitting layer, a hole injection layer, a hole transport layer, an electron injection layer or an electron transport layer, etc.

Further, the printing chamber 110 forming the organic layer by the inkjet printing method has been described, however the printing chamber 110 may also form an inorganic layer by the inkjet printing method.

Figure 4:
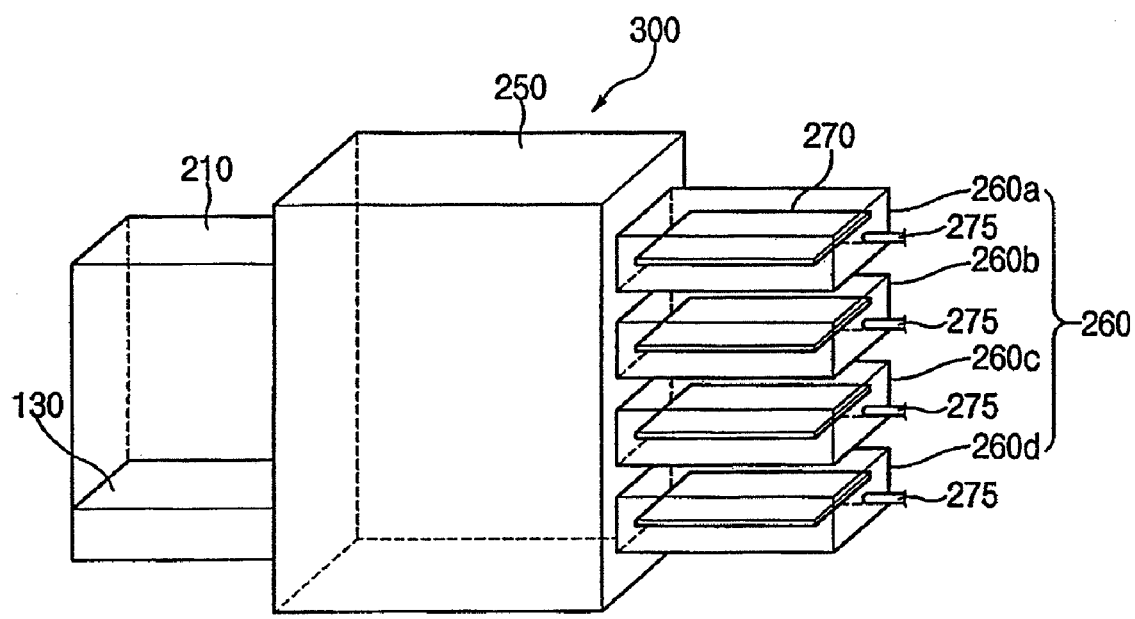
FIG. 4 is a schematic perspective view showing an apparatus for forming a thin film according to a second exemplary embodiment of the present invention.

FIG. 4 is a schematic perspective view showing an apparatus for forming a thin film according to a second exemplary embodiment of the present invention.

Referring to FIG. 4, an apparatus 300 for forming a thin film on a substrate includes a printing chamber 210, a buffer chamber 250 and four drying chambers 260. In the second embodiment, the thin film may be an organic layer or an inorganic layer, and the substrate may be a glass substrate. A process of forming the organic layer on a glass substrate, on which predetermined patterns are formed, by an inkjet printing method is performed in the printing chamber 210.

The buffer chamber 250 transfers the glass substrate from the printing chamber 210 to the drying chambers 260, and vice versa, on which the organic layer is formed.

The four drying chambers 260 dry the glass substrate on which the organic layer is formed. In the second embodiment, the printing chamber 210 forms the organic layer on the glass substrate by the inkjet printing method, and the printing chamber 210 may also form an inorganic layer on the glass substrate by inkjet printing method.

The printing chamber 210 has a structure capable of loading and unloading the glass substrate and maintaining a vacuum state or a pressurized state higher than an atmospheric pressure therein. The printing chamber 210 is coupled to a first side of the buffer chamber 250. The printing chamber 210 also has an inkjet printer 130 that coats an organic material on the glass substrate by the inkjet method. In FIG. 4, the same reference numerals denote the same elements in FIG. 2, and thus the detailed description of the inkjet printer 130 will be omitted.

The buffer chamber 250 has a structure capable of loading and unloading the glass substrate. The atmosphere in the buffer chamber 250 is identical with that of the printing chamber 210 or the four drying chambers 260. The drying chambers 260 include first, second, third and fourth drying chambers 260a, 260b, 260c and 260d.

The buffer chamber 250 is disposed between the printing chamber 210 and the four drying chambers 260. The glass substrate may be loaded into the first, second, third and fourth drying chambers 260a, 260b, 260c and 260d through the buffer chamber 250.

Although not shown in FIG. 4, the buffer chamber 250 further includes a transfer arm (not shown) transferring the glass substrate from the printing chamber 210 to the first, second, third and fourth drying chambers 260a, 260b, 260c and 260d, on which the organic layer is formed. Also, the transfer arm (not shown) may transfer the dried glass substrate in the drying chambers 260a, 260b, 260c and 260d to a process chamber (not shown) for a next process.

Each of the first to fourth drying chambers 260a, 260b, 260c and 260d includes a gas discharge part 275 so as to maintain a vacuum state inside the first to fourth drying chambers 260a, 260b, 260c and 260d. The gas discharge part 275 may have a vacuum pump (not shown) and a valve (not shown) to set a pressure in the first to fourth drying chambers 260a, 260b, 260c and 260d.

In the second embodiment, each of the first to fourth drying chambers 260a, 260b, 260c and 260d includes at least one substrate stage 270 supporting at least one glass substrate. The first to fourth drying chambers 260a, 260b, 260c and 260d are coupled to a second side opposite to the first side of the buffer chamber 250 such that the first to fourth drying chambers 260a, 260b, 260c and 260d are vertically overlapped with each other as shown in FIG. 4.

In accordance with the second embodiment, since the apparatus 300 has the four drying chambers 260 such as the first to fourth drying chambers 260a, 260b, 260c and 260d that may be independently controlled, the apparatus 300 may prevent contamination of the glass substrate while the organic layer is dried, and effectively reduce drying time of the organic layer on the glass substrate.

In the second embodiment, the thin film, for example, such as the organic layer, the inorganic layer, etc., formed on an organic light emitting diode has been described, but the thin film may be formed on a liquid crystal display apparatus by using the inkjet printing method. The organic layer may be a light emitting layer, a hole injection layer, a hole transport layer, an electron injection layer or an electron transport layer, etc.

Further, the printing chamber 210 forming the organic layer by the inkjet printing method has been described, however the printing chamber 210 may also form an inorganic layer by the inkjet printing method.

Figure 5:
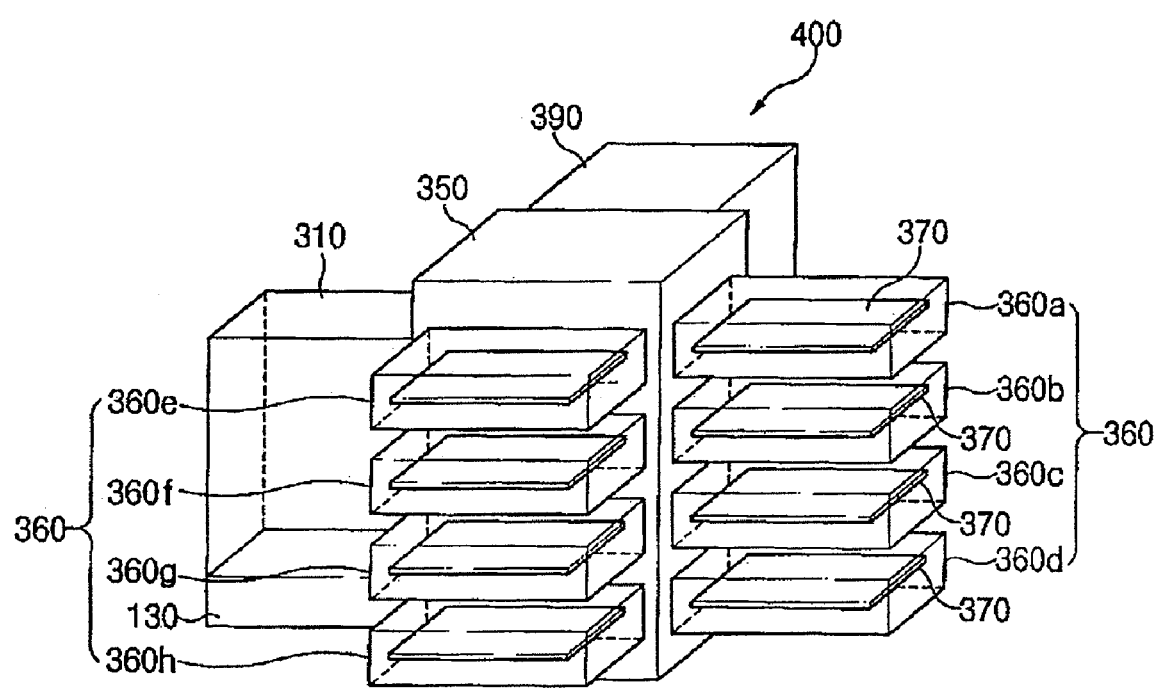
FIG. 5 is a schematic perspective view showing an apparatus for forming a thin film according to a third exemplary embodiment of the present invention.

FIG. 5 is a schematic perspective view showing an apparatus for forming an organic layer according to a third exemplary embodiment of the present invention.

Referring to FIG. 5, an apparatus 400 includes a printing chamber 310, a buffer chamber 350, eight drying chambers 360 and a cooling chamber 390. A process of forming the organic layer on a glass substrate is performed in the printing chamber 310 by using an inkjet printing method, on which predetermined patterns are formed.

The buffer chamber 350 transfers the glass substrate to the eight drying chambers 360, on which the organic layer is formed. The buffer chamber 350 may also transfer the glass substrate to the cooling chamber 390, on which the dried organic layer is formed.

The eight drying chambers 360 dry the glass substrate on which the organic layer is formed. In the third embodiment, the printing chamber 310 to form the organic layer on the glass substrate by the inkjet printing method has been disclosed, but the printing chamber 310 may form an inorganic layer on the glass substrate by inkjet printing method.

The printing chamber 310 has a structure capable of loading and unloading the glass substrate and maintaining a vacuum state or a pressurized state higher than an atmospheric pressure therein. The printing chamber 310 is coupled to a first side of the buffer chamber 350. The printing chamber 310 also has an inkjet printer 130 that coats an organic material on the glass substrate by the inkjet method. In FIG. 5, the same reference numerals denote the same elements in FIG. 4, and thus the detailed description of the inkjet printer 130 will be omitted.

The buffer chamber 350 has a structure capable of loading and unloading the glass substrate. The atmosphere in the buffer chamber 350 is identical with that of the printing chamber 310 or the eight drying chambers 360. The eight buffer chambers 360 includes first, second, third, fourth, fifth, sixth, seventh and eighth drying chambers 360a, 360b, 360c, 360d, 360e, 360f, 360g and 360h.

The buffer chamber 350 is disposed between the printing chamber 310, the eight drying chambers 360 and the cooling chamber 390. The glass substrate may be loaded into the first to eighth drying chambers 360a, 360b, 360c, 360d, 360e, 360f, 360g and 360h through the buffer chamber 350. Also, the glass substrate may be loaded into the cooling chamber 390 through the buffer chamber 350.

Although not shown in FIG. 5, the buffer chamber 350 further includes a transfer arm (not shown) transferring the glass substrate from the printing chamber 310 to the first to eighth drying chambers 360a, 360b, 360c, 360d, 360e, 360f, 360g and 360h, on which the organic layer is formed. On the contrary, the transfer arm (not shown) of the buffer chamber 350 may transfer the dried glass substrate to a process chamber (not shown) for a next process.

The first to fourth drying chambers 360a, 360b, 360c and 360d are coupled to a second side opposite to the first side of the buffer chamber 350 such that the first to fourth drying chambers 360a, 360b, 360c and 360d are vertically overlapped with each other. The glass substrate on which the organic layer is formed may be loaded to or unloaded from the first to fourth drying chambers 360a, 360b, 360c and 360d.

The fifth to eighth drying chambers 360e, 360f, 360g and 360h are coupled to a third side of the buffer chamber 350 such that the fifth to eighth drying chambers 360e, 360f, 360g and 360h are also vertically overlapped with each other. Also, the glass substrate on which the organic layer is formed may be loaded to or unloaded from the fifth to eighth drying chambers 360e, 360f, 360g and 360h.

In the third embodiment, each of the first to eighth drying chambers 360a, 360b, 360c, 360d, 360e, 360f, 360g and 360h includes at least one substrate stage 370 supporting at least one glass substrate. Each of the first to eighth drying chambers 360a, 360b, 360c, 360d, 360e, 360f, 360g and 360h further includes a heater (not shown) so as to dry the organic layer on the glass substrate supporting by the substrate stage 370. In the third embodiment, the thin film, for example, such as the organic layer, the inorganic layer, etc., formed on an organic light emitting diode has been described, but the thin film may be formed on a liquid crystal display apparatus by using the inkjet printing method. The organic layer may be a light emitting layer, a hole injection layer, a hole transport layer, an electron injection layer or an electron transport layer, etc.

Further, the printing chamber 310 forming the organic layer by the inkjet printing method has been described, however the printing chamber 310 may also form an inorganic layer by the inkjet printing method.

According to the present invention, the apparatus coating and drying the organic layer applied to the display panel, such as the organic light emitting diode, the liquid crystal display, etc., using the inkjet printing method includes at least two drying chambers that may be independently controlled. Each of the two drying chambers being independently controlled may completely dry solvent in the organic layer, thereby preventing contamination of the glass substrate due to the solvent remaining in the organic layer.

Further, since the glass substrate is dried in accordance with a loaded order into the drying chambers and transferred to the next process chamber in sequence, the apparatus may prevent a bottleneck of the thin film forming process, such as the organic layer, inorganic layer, etc., and enhance throughput thereof.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An apparatus of forming a thin film using an inkjet printing method, comprising:
   a printing chamber to form a thin film on a substrate;
   a buffer chamber to receive the substrate on which the thin film is formed;

at least two drying chambers to receive the substrate on which the thin film is formed from the buffer chamber, the drying chambers being independently controlled so as to dry the thin film on the substrate; and a cooling chamber to cool the substrate on which the dried thin film is formed.

2. The apparatus of claim 1, wherein the drying chambers are positioned at a first side of the buffer chamber, and wherein the cooling chamber is positioned at a second side of the buffer chamber, which is adjacent to the first side.

3. The apparatus of claim 1, wherein the printing chamber comprises an inkjet printer forming the thin film on the substrate by the inkjet printing method.

4. The apparatus of claim 1, wherein at least one of the drying chambers further comprises a heater supplying heat to the substrate.

5. The apparatus of claim 1, wherein each of the drying chambers comprises an air discharge portion so as to maintain a vacuum state therein.

6. An apparatus of forming a thin film using an inkjet printing method, comprising:

a printing chamber to form a thin film on a substrate;

at least two drying chambers to receive the substrate on which the thin film is formed and dry the thin film on the substrate; and a buffer chamber disposed between the printing chamber and the drying chambers so as to transfer the substrate from the printing chamber to the drying chambers, on which the thin film is formed, wherein the drying chambers are coupled to sides of the buffer chamber.

7. The apparatus of claim 6, wherein the printing chamber is coupled to a first side of the buffer chamber, wherein at least one of the drying chambers is coupled to a second side opposite to the first side of the buffer chamber, and wherein at least one of the drying chambers is coupled to a third side between the first and second sides of the buffer chamber.

8. The apparatus of claim 6, wherein the printing chamber is coupled to a first side of the buffer chamber, and the drying chambers are coupled to a second side opposite to or adjacent to the first side of the buffer chamber.

9. The apparatus of claim 8, wherein the drying chambers coupled to the second side of the buffer chamber are vertically overlapped.

10. The apparatus of claim 8, further comprising a cooling chamber coupled to a third side between the first and second sides of the buffer chamber.

* * * * *